United States Patent [19]
Bednorz et al.

[11] Patent Number: 4,520,570
[45] Date of Patent: Jun. 4, 1985

[54] PIEZOELECTRIC X-Y-POSITIONER

[75] Inventors: Johannes G. Bednorz, Adliswil, Switzerland; Ralph L. Hollis, Jr., Yorktown Heights, N.Y.; Martin Lanz; Wolfgang D. Pohl, both of Adliswil, Switzerland; Celia E. Yeack-Scranton, South Salem, N.Y.

[73] Assignee: International Business Machines Corporation, Armonk, N.Y.

[21] Appl. No.: 567,306

[22] Filed: Dec. 30, 1983

[51] Int. Cl.³ .............................................. G01B 5/00
[52] U.S. Cl. .................................... 33/180 R; 33/1 M
[58] Field of Search .................. 33/180 R, 1 M, 169 C

[56] References Cited

U.S. PATENT DOCUMENTS

| | | | |
|---|---|---|---|
| 1,987,733 | 1/1935 | De Fonbrune | 33/180 R |
| 2,815,697 | 12/1957 | Singer | 33/180 R |
| 2,988,928 | 6/1961 | De Fonbrune et al. | 33/180 R |
| 4,078,314 | 3/1978 | McMurtry | 33/1 M |
| 4,400,885 | 8/1983 | Consales | 33/169 C |

Primary Examiner—Willis Little
Attorney, Agent, or Firm—Graham S. Jones, II

[57] ABSTRACT

The positioner comprises a fixed frame (1) from which extends a first pair of parallel piezoelectric benders ("bimorphs") (2, 3) which carry an intermediate frame (4). Actuation of the bimorphs (2, 3) causes lateral translation of the intermediate frame (4) with respect to the fixed frame with the bimorphs (2, 3) forming the flexible sides of a parallelogram.

Attached to the intermediate frame (4) is a second pair of bimorphs (12, 13) which extend in a direction orthogonal to the direction of the first pair of bimorphs (2, 3) thus permitting a support frame (14) to exercise a deflection in a direction orthogonal with respect to the movement of the intermediate frame (4).

The bimorphs used consist of one or two piezoelectric elements carrying two or more electrodes on either side the proper actuation of which causes the benders to bend with parallel end surfaces at all times.

6 Claims, 19 Drawing Figures

PIEZOELECTRIC X-Y-POSITIONER

This invention relates to scanning and positioning devices permitting to reproducibly displace objects with a resolution in the order of 20 nm. Such devices, here commonly designated as positioners, find application in microscopy and manufacturing, particularly in the manufacturing of integrated circuits.

As the resolution of microscopes is improved (Optical Near-Field Microscope: 0.5/5 nm vertical/lateral resolution; Scanning Tunneling Microscope: 0.03/0.3 nm), there is an increasing requirement for positioning equipment permitting mutual displacements between microscope and probe in the nanometer range. The same requirement exists in the manufacture of electronic circuits with their thousands of circuit elements on a single chip of a few square millimeters, where consecutive masking, diffusion and etching steps are only possible if precise registration of the chip can be reproducibly achieved.

Traditionally, microscopes have a stage which can be displaced in x- and y-directions by means of a rack or lead-screw arrangement, often with facilities for coarse and fine adjustment. While these arrangements theoretically permit minute displacements of the stage, they are the more difficult to operate the smaller the desired displacements are. This is so because of a certain unavoidable backlash in the mechanism and because of the natural friction of the resting stage, which is only overcome with a sudden and mostly exaggerated movement. In view of the fact that the resolution of the new microscope developments and the requirements in electronic circuit manufacturing have increased over several orders of magnitude, it has become necessary to design new positioning devices which avoid the disadvantages of the prior art.

It is accordingly an object of the present invention to propose a positioning device which permits the reproducible displacement of a probe to be inspected, a circuit chip to be registered, or of a part of the microscope, by a distance in the order of one millimeter but with a resolution in the order of ten nanometers.

In accordance with the present invention, this object is met by a planar parallelogram configuration with bending legs. Spatially linear motion devices using parallelogram arrangements with flexible leaf springs are known in the printing art as exemplified by IBM Technical Disclosure Bulletin, Vol. 22, No. 7, December 1979, and EP-A1 No. 0012860, to provide linear displacement for print hammers or for an ink jet print head. In both cases, the parallelogram configuration is electromagnetically driven with amplitudes in the millimeter range.

The present invention relates to a piezoelectric positioner of the parallelogram type having a fixed frame and a support frame movable with respect to said fixed frame and adapted for supporting the object to be displaced. This positioner is characterized by at least one intermediate frame linked to said fixed frame by a first pair of piezoelectric benders in parallel extending in a first direction, said intermediate frame being linked to said support frame by a second pair of piezoelectric benders in parallel extending in a second direction orthogonal with respect to said first direction.

Details of a preferred embodiment of the invention will be described hereafter with reference to the accompanying drawings in which.

Figure 1:
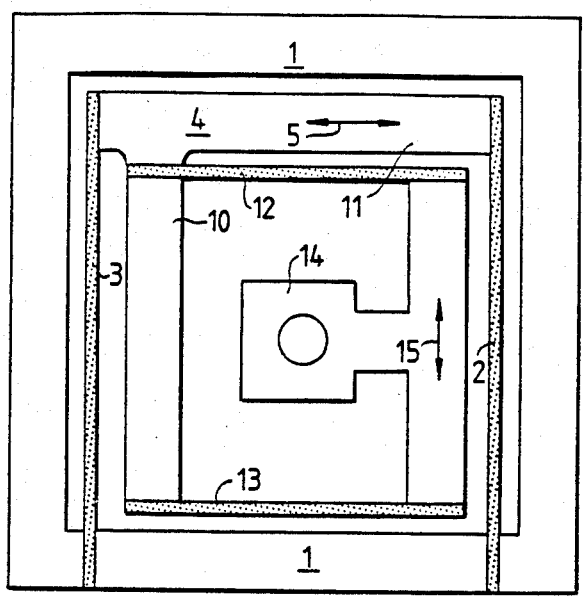
FIG. 1 is a schematic representation of a positioner in accordance with the invention.
Figures 13, 14:
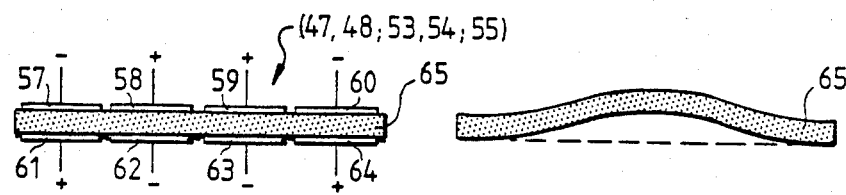
FIG. 13 shows the special form of bimorph with the electrodes split thrice, for use in the embodiment of FIG. 12.
Figure 15:
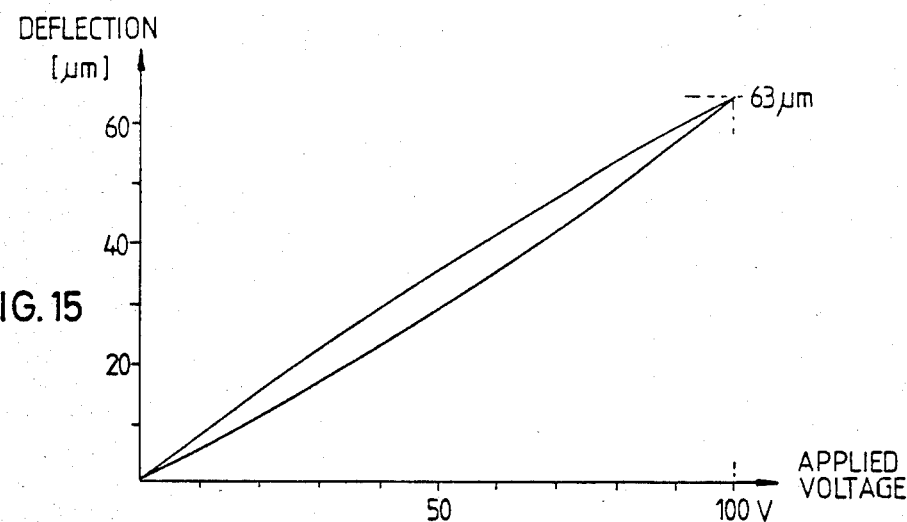
Figure 16:
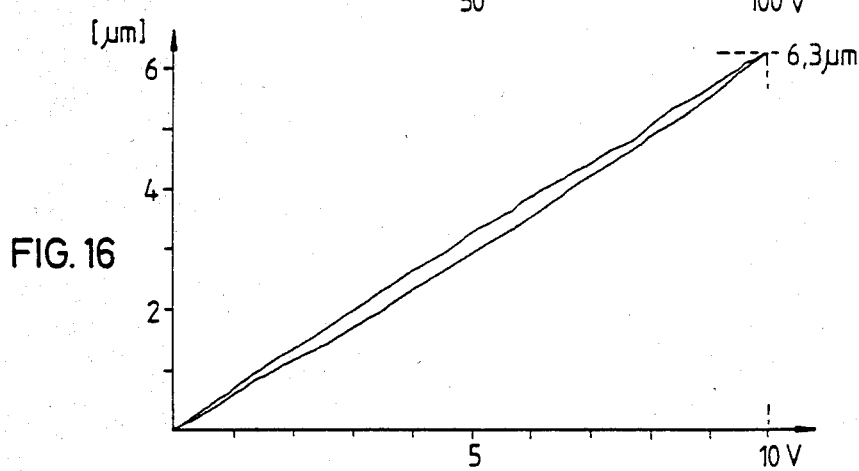
Figure 17:
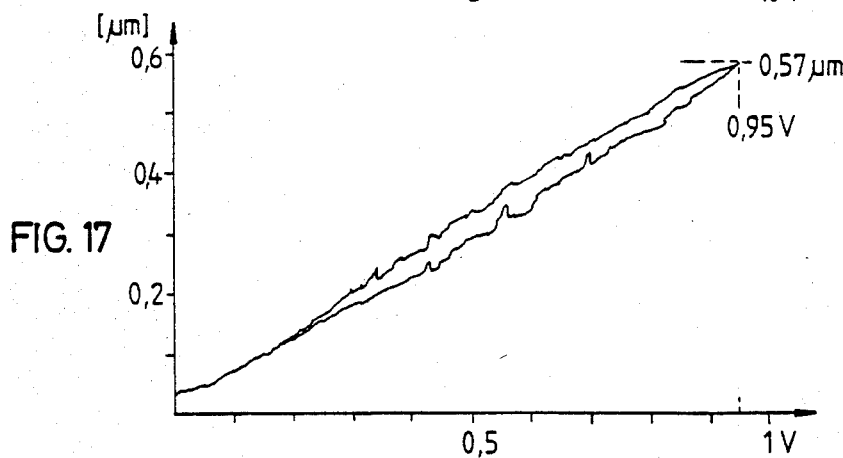

FIG. 14 indicates the shape the bimorph of FIG. 13 will assume when actuated;

FIG. 15 through 17 are diagrams showing the positioning accuracy achievable with the positioner of FIG. 1 for three different ranges of applied voltage.

Reference is made to FIG. 1 which shows a planar arrangement of two parallelogram translation devices. A fixed frame 1 carries a first pair of parallel piezoelectric benders 2 and 3 which are rigidly connected to frame 1 with one end, carrying between their other ends an intermediate frame 4. Obviously, as the piezoelectric benders 2 and 3 bend unison, intermediate frame 4 performs a translatory movement in the direction of arrow 5.

Figure 2A:
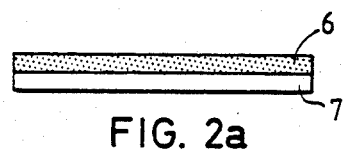
FIGS. 2a, 2b, 3a and 3b show two arrangements of bimorphs in unbent and bent states.
Figure 3A:
Figure 2B:
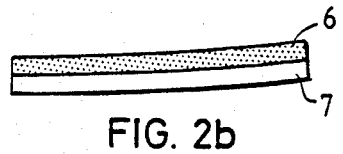
Figure 3B:

Piezoelectric benders of the type preferred for application in the positioner of the present invention are commonly known in the art as "bimorphs" and are commercially available. A bimorph consists either of a piezoelectric element 6 bonded to a non-piezoelectric flexible substrate 7 (FIG. 2a) or of two piezoelectric elements 8 and 9 (FIG. 3a) bonded together in such a way that the application of a potential to both of them causes one element to expand and the other to contract, thus producing twice the bending effect that is produced by the first-mentioned arrangement (FIG. 2b versus FIG. 3b).

Returning to FIG. 1, bimorphs 2 and 3 are arranged to bend to the same direction as a common potential is applied, and intermediate frame 4 translates. Frame 4 has an L-shaped configuration extending a leg 10 away from its leg 11 with which it attaches to bimorphs 2 and 3. Rigidly connected to leg 10 is a second pair of bimorphs 12 and 13 extending in a direction orthogonal to the direction of bimorphs 2 and 3. Bimorphs 12 and 13 between their free ends carry a support frame 14 to which a probe or microscope part (not shown) may be attached.

Assuming that frame 1 is held in a fixed position, the simultaneous application of a potential to bimorphs 2 and 3 will cause intermediate frame 4 to be displaced to or through along arrow 5 depending on the polarity of the applied potential. Obviously, with alternating current applied, frame 4 would oscillate within the frequency and amplitude limits dictated by the characteristics of the bimorphs employed and the masses involved. Be the translatory movement executed by frame 4 assigned to the x-direction. This movement is without ado imparted to bimorphs 12 and 13 and thence to support frame 14. Since bimorphs 12 and 13 remained without a potential so far, there will be no movement of frame 14 in the direction of arrow 15.

Conversely, with a potential applied to bimorphs 12 and 13 (and bimorphs 2 and 3 remaining idle) support frame 14 will execute a displacement along arrow 15 with respect to frame 1. This displacement may be assigned to the y-direction.

It will be clear that as potentials are applied to the first and second pairs of bimorphs, support frame 14, and with it the object carried, can be freely positioned along the x and y coordinates within an area defined by the bending characteristics of the bimorphs (and by the space provided between the parts involved).

Figure 4:
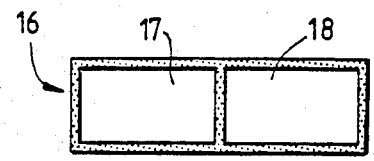
FIGS. 4 and 5 are respectively top plan view and side view of a bimorph with split electrodes.
Figure 5:
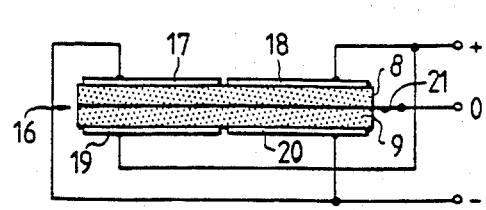
Figure 6:
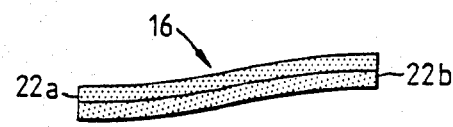
FIG. 6 shows the shape the bimorph of FIG. 5 will assume when actuated.
Figure 7:
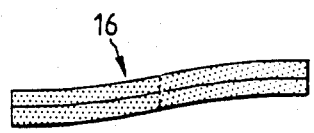
FIG. 7 through 10 represent further possible structures of bimorphs which may be used in the positioner of FIG. 1.

Those skilled in the art will have observed that owing to the rigidity with which the pairs of bimorphs 2, 3; 12, 13 are attached to frames 1, 4 and 14, and because of the bending characteristics of the bimorphs no exact linear displacement of support frame 14 is possible. The preferred embodiment in accordance with the invention, therefore, uses bimorphs of the type shown in FIG. 3, i.e. with two piezoelectric elements bonded together, but with their outer electrodes transversally segregated. FIG. 4 is a top plan view of a bimorph 16 with two outer electrodes 17 and 18 which are entirely separated. FIG. 5 shows the proposed connection of outer electrodes 17 through 20 and center electrode 21 to a voltage source. FIG. 6 gives an impression of the shape bimorph 16 will assume with the potential applied in accordance with FIG. 5. Of course, when the polarities at the outer electrodes 17 through 20 are reversed, bimorph 16 will bend to the opposite side. It will be noticed that the end surfaces 22a and 22b of bimorph 16 always remain parallel. If this type of bimorph is used in the configuration of FIG. 1, the displacement of support frame 4 will be exactly linear in x- and y-directions.

Other possibilities to obtain at least approximately linear displacements of support frame 14 are shown in FIGS. 7 through 10. Bimorph 16 of FIG. 7 consists of a combination of piezoelectric elements which have upwards polarization in one half and downward polarization in the other half thereof.

Figure 8:
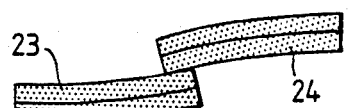
Figure 9:
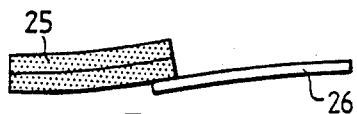
Figure 10:

FIG. 8 shows a series configuration of two bimorphs 23 and 24, FIG. 9 is a combination of one bimorph 25 with an elastic metal stripe 26, and FIG. 10 is a combination of a bimorph 27 with an elastic rubber block 28. It will be easy for a skilled person to properly connect the voltage source to the bimorph configurations of FIGS. 7 through 10.

Figure 11:
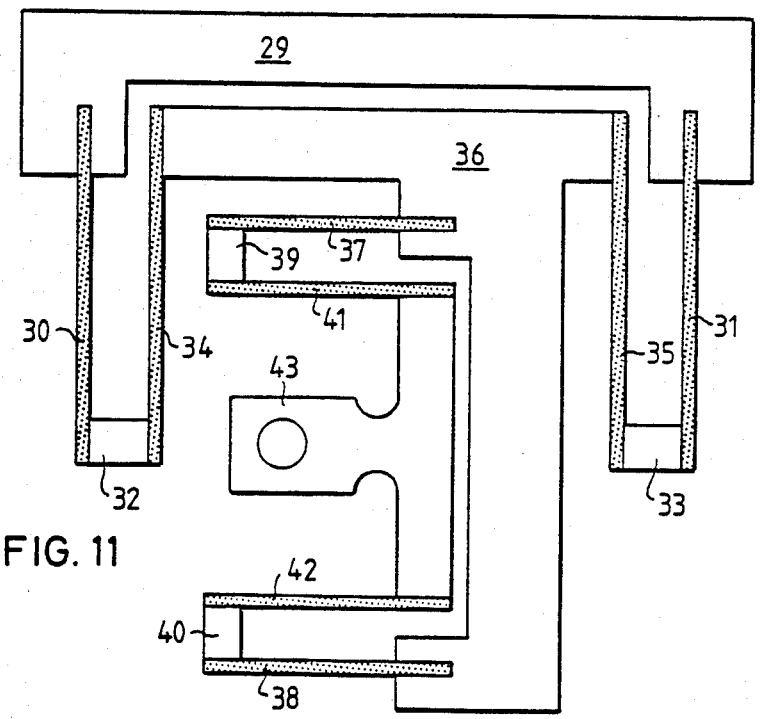
FIG. 11 is a schematic representation of a second embodiment of the positioner in accordance with the invention, with increased scan range over the positioner of FIG. 1.

FIG. 11 is an embodiment of the invention with increased scanning range. Mounted in a fixed frame 29 is a first pair of bimorphs 30 and 31 which are respectively connected to blocks 32 and 33 to which, in turn, a second pair of bimorphs 34 and 35 are fastened. The latter attach to an intermediary frame 36 which has an L-shaped configuration similar to frame 4 on FIG. 1. Frame 36 carries a third pair of bimorphs 37 and 38 which are fixed, respectively, to blocks 39 and 40 from which extends a fourth pair of bimorphs 41 and 42 which carry a support frame 43. With a voltage source appropriately connected to the various bimorphs a scanning range of twice the magnitude as with the configuration of FIG. 1 can be achieved.

Figure 12:
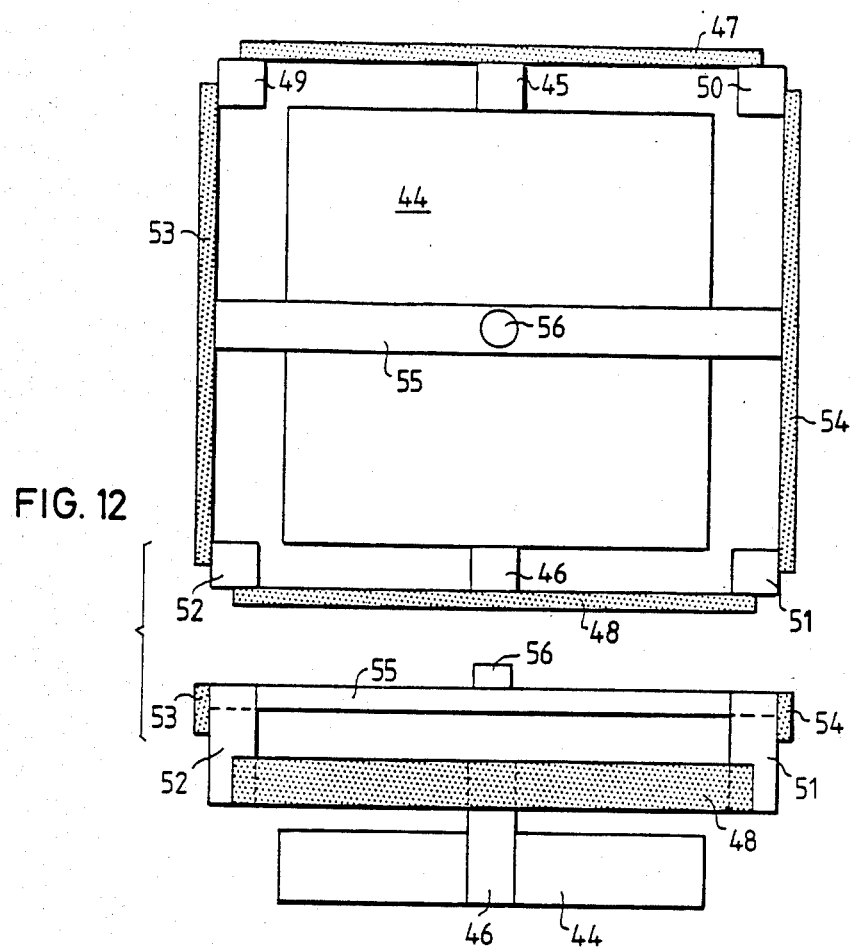
FIG. 12 shows a top plan view and a side elevation of a third embodiment of the positioner in a square arrangement.

Still another embodiment of the invention is shown in FIG. 12. A rigid frame 44 supports studs 45 and 46 to which bimorphs 47 and 48 are respectively attached with their centers. The free ends of bimorphs 47 and 48 carry connectors 49 through 52 to which bimorphs 53 and 54 are connected. A bridge 55 attaches with its ends to the centers of bimorphs 53 and 54, respectively. It carries a support 56.

In this embodiment, bimorphs 47, 48 and 53, 54 each consist of a piezoelectric element 65 which carries four independent electrodes (57 . . . 60; 61 . . . 64) on either side as shown in FIG. 13. With potentials applied as indicated, the bimorphs will bend to assume the shape depicted in FIG. 14.

It will be clear to those skilled in the art that bimorphs 47 and 48 as well as bimorphs 53 and 54 should be arranged so as to bend to the same side when a voltage is applied. The displacement of payload 56 generated by bimorphs 53 and 54 may be assigned to the x-direction, while the displacement caused by the bending of bimorphs 47 and 48 may be assigned to the z-direction.

If in addition a displacement in 2-direction is desired, bridge 55 is replaced by another bimorph on the support 56 of which the payload is placed.

The embodiment of FIG. 12 is particularly rigid allowing for fast acceleration and deceleration. The scanning range is, however, somewhat reduced as compared to the embodiments of FIGS. 1 and 11.

Measurements executed with an X-Y-Positioner built in accordance with this invention with commercially available bimorphs have yielded a conversion factor of between 0.4 and 1 $\mu m/V$ depending on the clamping length. Thus, with $\pm 50$ V an area of $0.1 \times 0.04$ mm$^2$ can be accessed.

With a sensor attached to support 14 of the embodiment of FIG. 1, its position accuracy was tested. FIG. 15 shows the test result for a scan performed with a maximum of 100 V applied voltage yielding a reproducible deflection of up to 63 $\mu m$. FIG. 16 shows the respective characteristic for scans with up to 10 V, and FIG. 17 that for scans with less than 1 V. The hysteresis observed is typical for piezoceramic material and can be easily accounted for, e.g. by appropriately programming the processor of the scan control circuitry. It was found that the positioner can be repositioned to a previously assumed location with an accuracy of about 20 nm. This accuracy corresponds to the resolution of the position sensor as can best be seen in the diagram of FIG. 17 for the 1 V scan.

We claim:

1. Piezoelectric X-Y-positioner of the parallelogram type having a fixed frame and a support frame movable with respect to said fixed frame and adapted for supporting the device to be positioned, characterized by at least one intermediate frame (4; 36; 49 . . . 52) linked to said fixed frame (1, 29, 44 . . . 46) by at least one pair of first piezoelectric benders (2, 3; 30, 31; 47, 48) in parallel extending in a first direction, said intermediate frame (4; 36; 49 . . . 52) being linked to said support frame (14, 43, 56) by at least one pair of second piezoelectric benders (12, 13; 37, 38; 53, 54) in parallel extending in a second direction orthogonal with respect to said first direction.

2. Positioner according to claim 1, characterized by two pairs of first piezoelectric benders (30, 31; 34, 35) connected respectively to said fixed frame (29) and to said intermediate frame (36) with a first set of intermediate blocks (32, 33) attaching between the free ends of said benders (30, 31; 34, 35), and by two pairs of second piezoelectric benders (37, 38; 41 42) conneced respectively to said intermediate frame (36) and to said support frame (43) with a second set of intermediate blocks (39, 40) attaching between the free ends of said second benders (37, 38; 41, 42).

3. Positioner according to claim 1, characterized in that a first intermediate frame (49 . . . 52) linked to said fixed frame (44 .46) by a pair of first piezoelectric benders (47, 48), that said first intermediate frame (49 . . . 52) carries a pair of second piezoelectric benders (53, 54), and that said support frame (56) is connected to a second intermediate frame (55) which takes the form of a bridge attached to the centers of said pair of second piezoelectric benders (53, 54), the arrangement being such that said pair of first piezoelectric benders (47, 48) when actuated performs a deflection along a first direction, and that said pair of second piezoelectric benders (53, 54) when actuated performs a deflection of said support frame (56) along a second direction orthogonal with respect to said first direction.

4. Positioner according to claim 3, characterized in that said second intermediate frame (55) is a piezoelectric bender which when actuated performs a deflection of said support frame (56) along a third direction orthogonal with respect to said first and second directions.

5. Positioner according to claim 1 or 2, characterized in that each piezoelectric bender (2, 3; 12, 13; 30, 31; 34, 35; 37, 38; 41, 42) consists of two piezoelectric elements (8, 9) bonded together such that they have one center electrode (21) in common, that their outer electrodes are transversally split in halves, and that the partial electrodes (17, 18; 19, 20) of each bender are connected to equal but opposite potentials.

6. Positioner according to claim 3, characterized in that each piezoelectric bender (47, 48; 53, 54; 55) consists of a piezoelectric element (65) having four independent electrodes (57 . . . 60; 61 . . . 64) on either side thereof.

* * * * *